US007003032B2

(12) United States Patent
Klemish et al.

(10) Patent No.: US 7,003,032 B2
(45) Date of Patent: Feb. 21, 2006

(54) GENERATION OF MULTIPLE INDEPENDENT HIGH RESOLUTION PULSE WIDTH MODULATIONS

(75) Inventors: Melissa Marie Klemish, Lapeer, MI (US); Robert Brady Gager, Flushing, MI (US); Lamar Harold McLouth, Davison, MI (US)

(73) Assignee: Delphi Technologies, Inc., Troy, MI (US)

( * ) Notice: Subject to any disclaimer, the term of this patent is extended or adjusted under 35 U.S.C. 154(b) by 748 days.

(21) Appl. No.: 10/075,985

(22) Filed: Feb. 15, 2002

(65) Prior Publication Data

US 2003/0156636 A1  Aug. 21, 2003

(51) Int. Cl.
*H03K 7/08* (2006.01)
*H03K 9/08* (2006.01)
(52) U.S. Cl. .................... 375/238; 370/205; 370/212
(58) Field of Classification Search ............... 329/312; 370/205, 212; 375/21, 172, 238
See application file for complete search history.

(56) References Cited

U.S. PATENT DOCUMENTS

| | | | |
|---|---|---|---|
| 5,498,947 A * | 3/1996 | Wang et al. | 318/811 |
| 5,675,297 A | 10/1997 | Gose et al. | |
| 5,818,678 A | 10/1998 | Berg et al. | |
| 6,138,047 A * | 10/2000 | Proffitt et al. | 700/14 |
| 6,400,232 B1 | 6/2002 | Good et al. | |
| 2002/0113555 A1 * | 8/2002 | Lys et al. | 315/149 |

OTHER PUBLICATIONS

Microprocessor controlled inverter for UPS applications Khan, M.Z.U.; Manning, C.D.; Power Electronics and Variable-Speed Drives, Third International Conference on Jul. 13-15, 1988 Page(s):161-164.*

* cited by examiner

*Primary Examiner*—Stephen Chin
*Assistant Examiner*—Erin M. File
(74) *Attorney, Agent, or Firm*—Stefan V. Chmielewski

(57) ABSTRACT

A method for generating multiple high-resolution PWM signals in which software interrupts are introduced at predetermined intervals to generate multiple high-resolution PWM signals from a conventional microprocessor. The software determines the purpose of the interrupt in an interrupt subroutine. An interrupt occurs when a compare register equals the timer. Another interrupt occurs when the timer overflows. The interrupts are the key to generating the multiple high-resolution PWM signals.

13 Claims, 3 Drawing Sheets

GENERATION OF MULTIPLE INDEPENDENT HIGH RESOLUTION PULSE WIDTH MODULATIONS

TECHNICAL FIELD

The present invention relates to pulse width modulated (PWM) signals and more particularly to high-resolution PWM signals.

BACKGROUND OF THE INVENTION

PWM signals are used in a variety of applications. Some examples of typical applications include controlling motor speed, controlling lighting intensity, and controlling the movement of a gage pointer to name just a few.

Pulse width modulation is the changing of a signal's duty cycle within a fixed period. The resolution of a PWM signal is defined by the number of different duty cycles in the signal and the number of steps at which the signal transitions within a period. For example, a PWM signal having a duty cycle of 50% is on half of the time and off half of the time while a PWM signal having duty cycle of 75% is on three-quarters of the time and off one-quarter of the time. The number of steps at which the signal transitions within a period is its resolution, $2^n$. A PWM signal having 8-bit resolution can have 256, or $2^8$, different duty cycles, while a 10 bit resolution signal has 1024, or $2^{10}$, different duty cycle values. High-resolution is typically a resolution greater than 8-bit.

PWM signals are generated using hardware such as a microprocessor integrated peripheral. The peripheral device is limited in the number of PWM signals that it can generate, and is typically limited to four or fewer signals. Hardware is available that can generate more than four signals, but becomes very expensive and therefore, is not always an option for many applications. Many applications for PWM signals require more than four signals, an example being as many as 15 signals that are required for an application such as an automotive instrument cluster. However, a more expensive processor is not necessarily a cost-effective solution for many applications.

There is a need for a simple, inexpensive method of generating high-resolution PWM signals without the need for expensive additional hardware.

SUMMARY OF THE INVENTION

It is an object of the present invention to generate multiple independent high-resolution pulse width modulations. It is another object of the present invention to provide software that is compatible with standard microprocessors in order to generate high-resolution PWM signals. It is yet another object of the present invention to provide a software program that manipulates microprocessor hardware to generate multiple high-resolution PWM signals.

The present invention introduces software interrupts at predetermined intervals to generate multiple high-resolution PWM signals from a conventional microprocessor. The software determines the purpose of the interrupt in an interrupt subroutine. An interrupt occurs when a compare register equals the timer. Another interrupt occurs when the timer overflows. The interrupts are the key to generating the multiple high-resolution PWM signals.

The software of the present invention creates a PWM generation table that has a unique entry for each unique duty cycle and the port values at the time that a unique duty cycle is compared with the timer. At the end of the table, there is a value called an invalid duty cycle value, which allows the timer to overflow. The PWM generation table is then used to generate the interrupts and the PWM signals.

The present invention provides a low cost method of generating high-resolution PWM signals and can be incorporated with any microprocessor having a capture and compare module. According to the present invention, the number of PWM signals is not limited by the hardware microprocessor as in the prior art where each PWM required one more set of PWM hardware. The number of PWM signals in the present invention is limited only by the number of general input and output ports available on the processor.

Other objects and features of the present invention will become apparent when viewed in light of the detailed description of the preferred embodiment when taken in conjunction with the attached drawings and appended claims.

BRIEF DESCRIPTION OF THE DRAWINGS

In order that the present invention may be well understood, there will now be described some embodiments thereof, given by way of example, with reference to the accompanying drawings, in which.

DESCRIPTION OF THE PREFERRED EMBODIMENT

Figure 1:
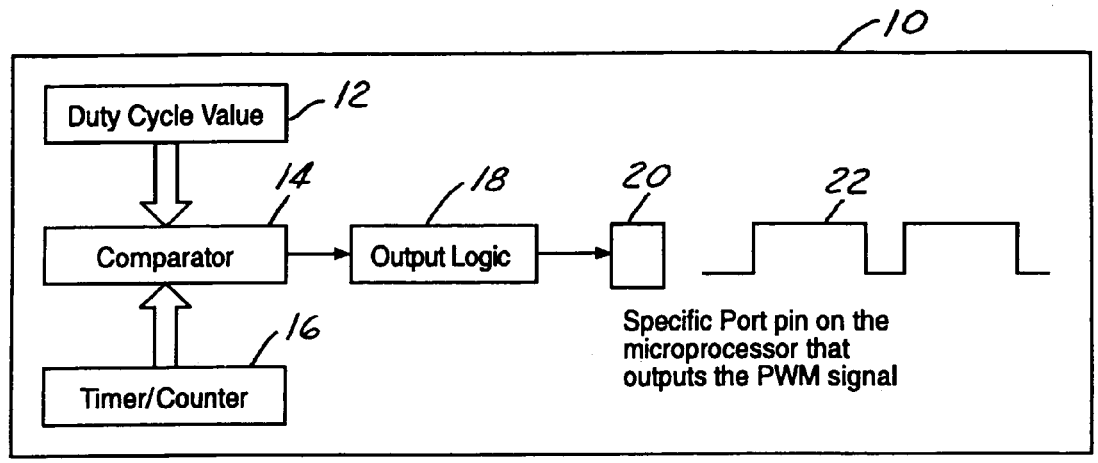
FIG. 1 is a prior art example of a typical capture and compare module of a microprocessor used to generate a single PWM signal.

FIG. 1 is a prior art example of a typical capture and compare module 10 used in the generation of a single PWM signal. To generate a single PWM signal, a duty cycle value 12 is compared, by way of a comparator 14, to a continuous timer 16. In the present example, the timer 14 is a 16-bit timer that counts from 0 to 65535.

When the duty cycle value 12 is equal to the value of the count in the timer 16, output logic 18 sets a predefined hardware pin 20 high. When the timer overflows from 65535 to zero, the output logic 18 sets pin 20 low again. In this regard, changing the duty cycle value 12 in a duty cycle register, (not shown), changes the duty cycle of the PWM signal. An example signal 22 is shown in FIG. 1. Changing the point at which the timer starts counting changes the period. For example, changing the beginning of the count from 0, to 300 would shorten the period, and increase the frequency of the PWM signal.

The present invention uses a software program to manipulate the hardware described above in order to generate multiple high-resolution PWM signals. For example purposes, the invention will be described as it generates fifteen high-resolution PWM signals. However, one skilled in the art is capable of generating more or fewer signals without departing from the scope of the present invention.

Figure 2:
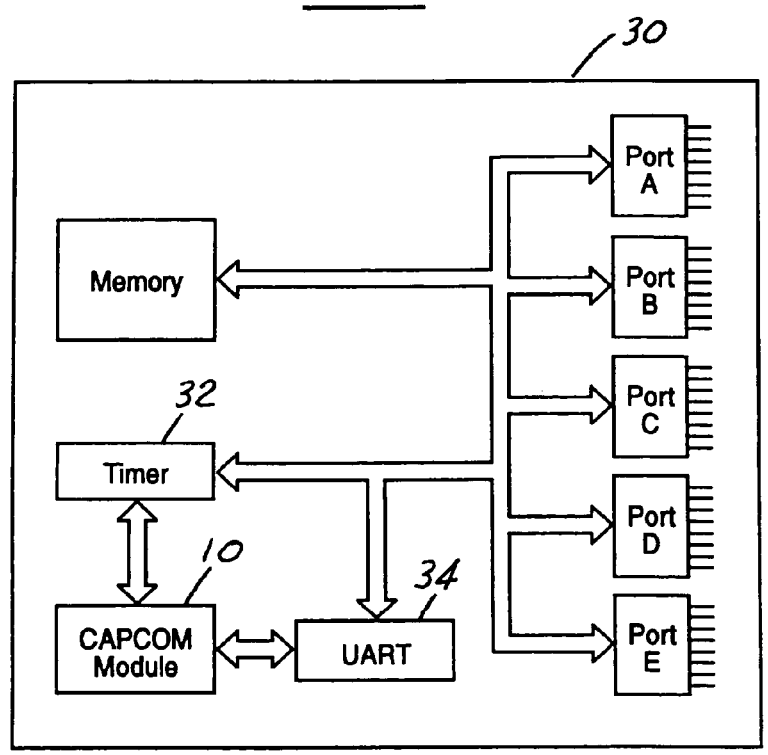
FIG. 2 is a block diagram of the processor components utilized in the present invention and their relationship to each other.

Referring now to FIG. 2, the present invention is used in conjunction with an 8-bit processor 30 that manipulates a 16-bit timer 32, a Universal Asynchronous Receiver/Transmitter (UART) communication bus 34 and the capture and compare module 10. According to the present invention, the capture and compare module 10 generates a software interrupt when its compare register equals the timer value. While a 16HC73B PIC 8-bit processor and a 16-bit timer are shown and described herein, it should be noted that any processor with a communication bus, a capture/compare module, or a PWM module, and a timer can be used in accordance with the present invention.

The processor 30 receives duty cycle values from any one of many sources such as another microcontroller, a personal computer, or any other device capable of transmitting data by way of the UART communication bus 34.

Figure 3:
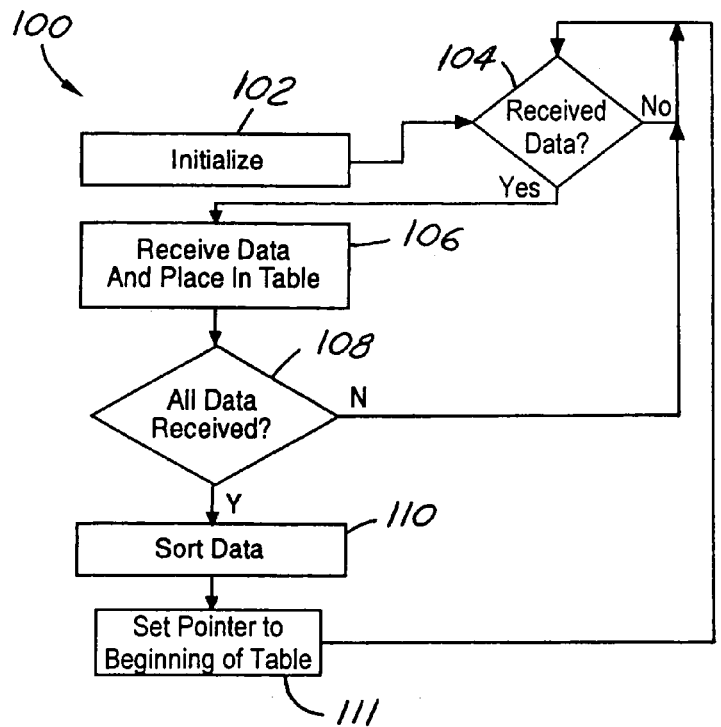
FIG. 3 is a flow chart of the software algorithm of the present invention.

A block diagram of the software 100 of the present invention is shown in FIG. 3. The I/O ports, UART communication and interrupts are all initialized 102. The program receives 104 data and then places 106 the data in a table that represents the duty cycle values. The program then checks 108 to see if all data has been received. The program will continue to receive data 104 and fill 106 the table until all data is present. Once the table is full, the software calls 110 a sort routine where a PWM generation table is created. A pointer is set 111 to the beginning of the table and the program waits for the receipt 104 of new data.

Figure 5:
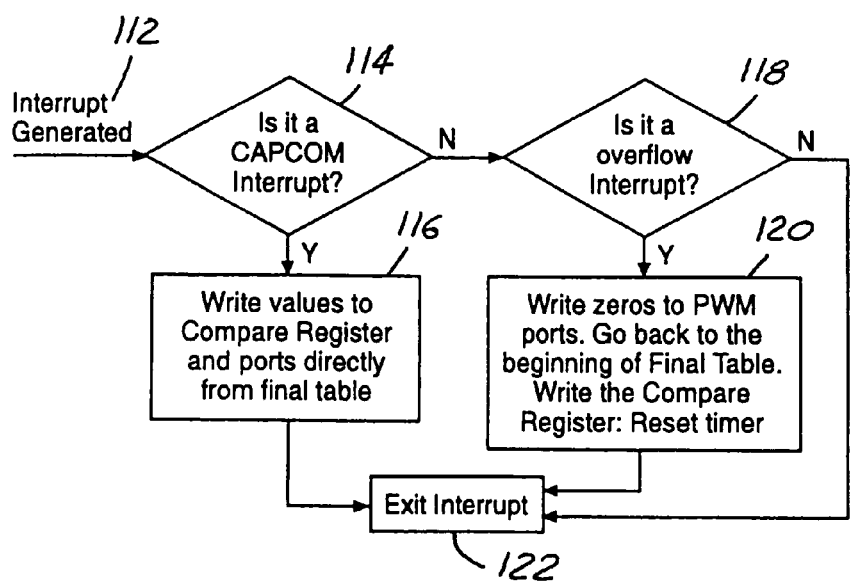
FIG. 5 is a flow chart of an interrupt subroutine used in sorting the duty cycle value table according to the present invention.

Referring to FIG. 5, when an interrupt is generated 112, the software decides 114 what type of interrupt occurred and reacts accordingly. An interrupt is generated from two different sources according to the present invention. A capture and compare interrupt and a timer overflow interrupt. For a capture and compare interrupt generated by a match between the timer and the duty cycle register, the program generates the PWM signals 116 as defined by the PWM generation table. In the event the interrupt is a result of the timer overflow 118, the program resets the ports and returns to the beginning of the PWM generation table 120. Finally, the exit routine is exited 122.

Figure 4:
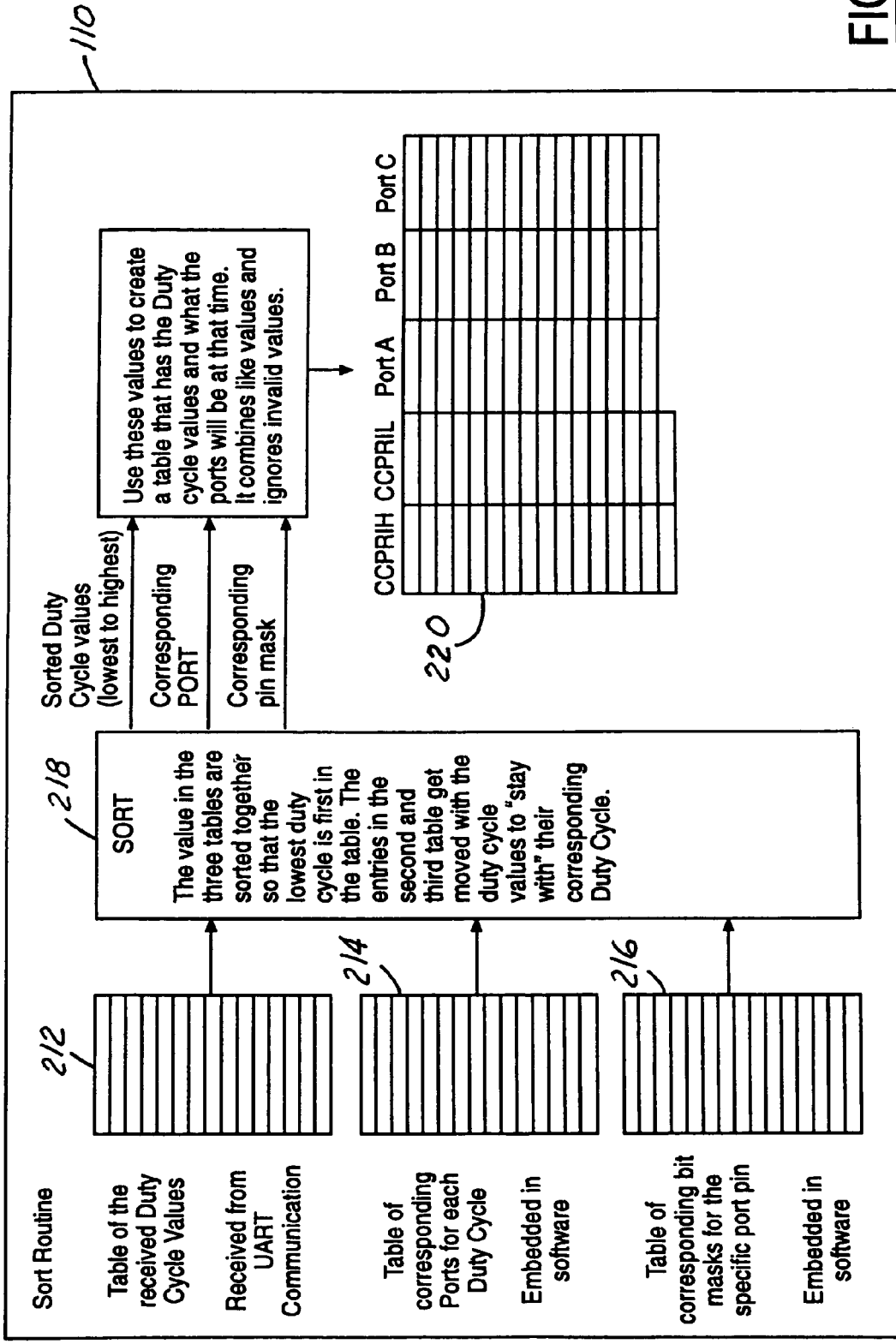
FIG. 4 is a flow chart of a sort routine for building a table of duty cycle values according to the present invention.

FIG. 4 is a block diagram of the sort routine 110. The data that has been received is placed in a duty cycle table 212 and sorted along with data that is stored in two other tables embedded in the software. A table 214 contains corresponding ports for each duty cycle and a table 216 contains corresponding bit masks for the specific port pin, also embedded in the software. The duty cycle table 212 is immediately over written upon receipt of new data. The port table 214 and the bit-mask table 216 have constant values that depend on the specific application.

The software sorts 218 the table 212 of duty cycle values from lowest to highest. The entries in the second 214 and third 216 tables are moved with their corresponding entries from the duty cycle table 212 in order to build a PWM generation table 220 that is used in the interrupt routine. The PWM generation table 220 contains the duty cycle values, the port, and the time that the duty cycle values will be at the ports.

The sort routine 110 will combine like values and ignore invalid values when building the PWM generation table 220. For example, if all the ports have the same duty cycle, there will be only one entry in the PWM generation table 220. There is a separate entry for each duty cycle. At the end of the PWM generation table, there is an invalid duty cycle value. The invalid duty cycle value is a value that can never be equal to the timer. The presence of this value in the table allows the timer to overflow.

Referring again to FIG. 3, in the present invention, all of the receiving 104, 106, 108 and sorting 110 is done in the processor's background memory. The PWM signals are generated during an interrupt routine, which is entered upon generation 112 of an interrupt. During the interrupt routine, for a capture and compare interrupt 116, the port pins are set high and low to generate the PWM signals. The interrupt routine is entered only when the duty cycle register matches the timer, or when the timer overflows. Because there is only one interrupt, the processor must decide why it received that interrupt.

Referring to FIG. 5, there is shown a detailed flow diagram of the interrupt routine 113. When an interrupt is generated 112, the program determines if the interrupt is due to a match between the timer value and the duty cycle value. If so, this is considered a CAPCOM interrupt 114 and the next step is to write values 116 to a compare register and the pin ports directly from the PWM generation table.

Should the program determine the interrupt is a result of the timer overflowing 118, then the program 120 writes zeros to the PWM port and returns to the beginning of the PWM generation table. Ultimately, the interrupt routine is exited 122.

Referring again to FIG. 4, during initialization, the processor configured and started the capture/compare module and places the first two values of the PWM generation table into the duty cycle register, CCPR1H and CCPR1L. Referring back to FIG. 3, when the timer equals the values in the CCPR1H and CCPR1L registers, an interrupt will occur and the interrupt routine 112 is initiated. The interrupt sets the appropriate ports high. This being previously determined in the sort routine. The interrupt routine 112 does not need to determine which pins are set. It merely reads from the PWM generation table and places values to other registers, i.e. PORTA, PORTB, PORTC, CCPR1H, and CCPR1L to set up the next time it should interrupt.

Once the interrupt routine is exited, it will not be entered again until the timer equals the new values in the CCPR1H and CCPR1L registers. This will continue until the invalid values that were placed at the end of the PWM generation table are loaded into CCPR1H and CCPR1L. These values are invalid because they are values to which the timer will never equal. Therefore, an interrupt will not be generated and the next interrupt will occur when the timer overflows from 65535 to zero.

At this point in time, all of the ports are set to low and a pointer is returned to the beginning of the PWM generation table. The first two values placed in the PWM generation table are placed in the duty cycle registers, CCPR1H and CCPR1L, and the cycle begins again.

According to the present invention, and assuming a 20 MHz external clock, the resolution obtained for a 240 Hz period is approximately 9-bits, for a 120 Hz period, it is approximately 10-bits and for a 75 Hz period, the resolution is over 10-bits. Multiple PWM signals having such high resolutions are possible because of the fact that the processing and table generation is done in a background task.

While particular embodiments of the invention have been shown and described, numerous variations and alternate embodiments will occur to those skilled in the art. Accordingly, it is intended that the invention be limited only in terms of the appended claims.

What is claimed is:

1. A method for generating multiple high-resolution pulse width modulated (PWM) signals comprising the steps of:

receiving data representative of duty cycle values;

sorting said duty cycle values in a duty cycle table to generate a PWM generation table;

generating an interrupt from a capture and compare interrupt defined by a match between a timer value and a duty cycle register;

generating an interrupt from a timer overflow;

generating multiple PWM signals as defined by said PWM generation table upon detection of said capture and compare interrupt; and returning to a beginning point in said PWM generation table upon generation of a timer overflow interrupt, wherein said step of sorting said duty cycle values further comprises the steps of:

sorting said duty cycle values along with data stored in a port table containing port pin assignments for each duty cycle value; and sorting said duty cycle values along with data stored in a bit-mask table containing bit-mask assignments corresponding to a specific port pin assignment.

2. The method as claimed in claim 1 wherein said step of sorting said duty cycle values is done in a background task.

3. A system for generating multiple high-resolution pulse width modulated (PWM) signals comprising:

a microprocessor having a timer, said microprocessor for receiving duty cycle values;

a communication bus for sending duty cycle values to said microprocessor;

a capture and compare module operative to selectively generate software interrupts as a function of timer and duty cycle values in communication with said microprocessor;

a duty cycle table at a predetermined location in memory of said microprocessor, said duty cycle table for storing said duty cycle values;

a port table having port assignments corresponding to a duty cycle value in said duty cycle table, said port table being stored in memory of said microprocessor;

a bit-mask table having bit-mask assignments corresponding to a port assignment in said port table, said bit-mask table being stored in memory of said microprocessor;

a PWM generation table created by sorting said duty cycle table, said port table and said bit-mask table upon receipt of all duty cycle values; and an interrupt routine that is entered only upon generation of an interrupt wherein said interrupt routine allows said microprocessor to write a predetermined duty cycle value from said PWM generation table to a predetermined port assignment from said PWM generation table.

4. The system as claimed in claim 3 wherein said interrupt is generated by a match between a value of said timer and a duty cycle value; and said predetermined values are written to said port assignment from said PWM generation table.

5. The system as claimed in claim 3 wherein said interrupt is generated by a timer overflow and said predetermined values for said port assignments are all low.

6. A method for generating multiple high-resolution pulse width modulated (PWM) signals in a system having a microprocessor, a communication bus, and a timer, said method comprising the steps of:

receiving a plurality of duty cycle values at said microprocessor;

placing said duty cycle values in a duty cycle table wherein each duty cycle value has a corresponding port assignment in a port table and a corresponding bit-mask assignment in a bit-mask table, said port and bit-mask tables being embedded in software in said microprocessor;

generating a PWM generation table by sorting said duty cycle, port and bit-mask tables in a background task of said microprocessor;

generating a capture and compare interrupt when a source of said interrupt is when a timer value matches a duty cycle value;

generating a timer overflow interrupt when a source of said interrupt is an overflow of said timer;

receiving an interrupt at said microprocessor;

determining a source for said received interrupt;

writing predetermined values to a plurality of pins on said microprocessor based on said source for said interrupt;

writing values to a plurality of ports wherein said values are taken directly from said PWM generation table during a capture and compare interrupt;

writing a low value to a plurality of pins during a timer overflow interrupt; and returning to a beginning point in said PWM generation table upon generation of a timer overflow interrupt.

7. The method as claimed in claim 6 wherein said step of generating a PWM generation table further comprises placing an invalid duty cycle value at the end of said PWM generation table, said invalid duty cycle value being a value that can never be equal to a value of said timer.

8. A method for generating multiple high-resolution pulse width modulated (PWM) signals comprising the steps of:

receiving data representative of duty cycle values;

sorting said duty cycle values in a duty cycle table to generate a PWM generation table;

generating an interrupt from a capture and compare interrupt defined by a match between a timer value and a duty cycle register;

generating an interrupt from a timer overflow;

generating multiple PWM signals as defined by said PWM generation table upon detection of said capture and compare interrupt; and returning to a beginning point in said PWM generation table upon generation of a timer overflow interrupt, wherein said step of sorting said duty cycle values to generate a PWM generation table further comprises the step of placing an invalid duty cycle value at the end of the PWM generation table, wherein said invalid duty cycle value is a value that is not equal to said timer value for allowing the timer to overflow.

9. A method for generating multiple high-resolution pulse width modulated (PWM) signals comprising the steps of:

receiving data representative of duty cycle values;

sorting said duty cycle values in a duty cycle table to generate a PWM generation table;

generating an interrupt from a capture and compare interrupt defined by a match between a timer value and a duty cycle register;

generating an interrupt from a timer overflow;

generating multiple PWM signals as defined by said PWM generation table upon detection of said capture and compare interrupt; and returning to a beginning point in said PWM generation table upon generation of a timer overflow interrupt, wherein said step of generating an interrupt further comprises the step of writing values to a plurality of port pins directly from said PWM generation table.

10. A method for generating multiple high-resolution pulse width modulated (PWM) signals comprising the steps of:
- receiving data representative of duty cycle values;
- sorting said duty cycle values in a duty cycle table to generate a PWM generation table;
- generating an interrupt from a capture and compare interrupt defined by a match between a timer value and a duty cycle register;
- generating an interrupt from a timer overflow;
- generating multiple PWM signals as defined by said PWM generation table upon detection of said capture and compare interrupt; and
- returning to a beginning point in said PWM generation table upon generation of a timer overflow interrupt, wherein said step of generating an interrupt from a timer overflow further comprises the step of resetting a plurality of port pins to low.

11. The method as claimed in claim 8 wherein said step of sorting said duty cycle values is done in a background task.

12. The method as claimed in claim 9 wherein said step of sorting said duty cycle values is done in a background task.

13. The method as claimed in claim 10 wherein said step of sorting said duty cycle values is done in a background task.

* * * * *